United States Patent [19]
Yilmaz

[11] Patent Number: 5,168,331
[45] Date of Patent: Dec. 1, 1992

[54] POWER METAL-OXIDE-SEMICONDUCTOR FIELD EFFECT TRANSISTOR

[75] Inventor: Hamza Yilmaz, Saratoga, Calif.

[73] Assignee: Siliconix Incorporated, Santa Clara, Calif.

[21] Appl. No.: 648,711

[22] Filed: Jan. 31, 1991

[51] Int. Cl.⁵ .............................................. H01L 29/78
[52] U.S. Cl. .................... 257/331; 257/339; 257/495
[58] Field of Search .................. 357/23.4, 23.8, 13

[56] References Cited

U.S. PATENT DOCUMENTS

| | | | |
|---|---|---|---|
| 4,503,449 | 3/1985 | David et al. | 357/23.4 |
| 4,553,151 | 11/1985 | Schutten et al. | 357/23.4 |
| 4,835,585 | 5/1989 | Panousis | 357/23.4 |
| 4,835,586 | 5/1989 | Cogan et al. | 357/23.4 |
| 4,893,160 | 1/1990 | Blanchard | 357/23.4 |
| 5,072,266 | 12/1991 | Buluccea et al. | 357/23.4 |

OTHER PUBLICATIONS

Yilmaz, H. et al., *Insulated Gate Transistor Physics: Modeling and Optimization of the On-State Characteristics*, IEEE Transactions on Electron Devices, vol. ED-32, No. 12, Dec. 1985, pp. 2812-2818.

*Primary Examiner*—William D. Larkins
*Attorney, Agent, or Firm*—Skjerven, Morrill, MacPherson, Franklin & Friel

[57] ABSTRACT

A metal-oxide-semiconductor field effect transistor constructed in a trench or groove configuration is provided with protection against voltage breakdown by the formation of a shield region adjacent to the insulating layer which borders the gate of the transistor. The shield region is either more lightly doped than, or has a conductivity opposite to, that of the region in which it is formed, normally the drift or drain region, and it is formed adjacent to a corner on the boundary between the insulating layer and the drift or drain region, where voltage breakdown is most likely to occur.

39 Claims, 15 Drawing Sheets

POWER METAL-OXIDE-SEMICONDUCTOR FIELD EFFECT TRANSISTOR

FIELD OF THE INVENTION

This invention relates to power metal-oxide-semiconductor transistors and, more particularly, such transistors which include a gate region that is constructed in a groove or trench configuration.

BACKGROUND OF THE INVENTION

Power metal-oxide-semiconductor field effect transistors (MOSFETs) have frequently been constructed in the configuration shown in FIG. 1, which shows in cross section a portion of a MOSFET which includes a drain region 10, a source region 11 and a gate 12. Drain region 10 and source region 11 are arranged in a vertical configuration and gate 12 is in a groove or trench configuration. Drain region 10 and source region 11 are both formed of heavily doped N material and gate 12 consists of polysilicon. Layered between drain region 10 and source region 11 are a drift region 13, which is made of a lightly doped N material, and a body region 14, which is made of P material. An insulating layer 15 is interposed between gate 12 and the semiconductor materials, and a dielectric region 19 is partially enclosed by gate 12. Insulating layer 15 and dielectric region 19 are typically formed of silicon dioxide. Drain region 10 is connected to a drain contact 16. Source region 11 is connected to a source contact 17 which provides electrical contact between source region 11 and body region 14. Gate 12 is connected to a gate connection pad on the chip in a manner to be described below.

The device shown in FIG. 1 is in an "off" condition when gate 12 is grounded. When a positive voltage is applied to drain terminal 16 so as to reverse-bias the P-N junction between drift region 13 and body region 14, an electric field is set up within drift region 13. It is known in the art that the electric field reaches its maximum strength on the boundary of insulating layer 15 and drift region 13 at or near a corner in the profile of the gate, such as the point designated as 18 in FIG. 1. The concentration of the electric field at point 18 has frequently led to a voltage breakdown there, which can create oxide traps or pin holes in insulating layer 15, and can result in a short-circuit between drift region 13 and gate 12. Whatever the consequence, a voltage breakdown of this kind can permanently damage the device and render it unfit for further use.

Several ways of solving this problem had been proposed in the prior art. For example, the corner of insulating layer 15 at point 18 can be rounded, as shown in FIG. 2. While this tends to reduce the strength of the electric field in this area and renders the device somewhat more resistant to voltage breakdown, the improvement in this regard is not significant.

Another solution proposed in the prior art is to form a well 20 of heavily doped P material, as shown in FIG. 2. The creation of a P-N junction between well 20 and drift region 13, however, has the undesirable effect of creating a junction field effect transistor in the area designated as 21 in FIG. 2. This tends to choke off the current between drain terminal 16 and source terminal 17. In addition, the creation of a well reduces the cell density possible in the device.

SUMMARY OF THE INVENTION

In accordance with this invention, a layer of the drift region immediately below the gate in a grooved power MOSFET is doped with ions of a conductivity type opposite to that of the drift region. This creates a "free floating" shield region within the drift region which serves as a buffer to reduce the strength of the electric field in the drift region at the point where it reaches a maximum level, which is adjacent to a corner in the profile of the gate. The shield region can be doped to an extent that it takes a conductivity type opposite to that of the drift region, or to a lesser degree such that its conductivity type remains the same as, but weaker than, the drift region.

The introduction of a shield region in accordance with the invention reduces the field strength at the point where it reaches its maximum strength by a factor of 4 or 5. Moreover, if breakdown does occur in a device constructed in accordance with the invention, it will take place at a point on a P-N junction at some distance from the gate electrode. Thus, the reliability of the MOSFET is improved, because the magnitude of the breakdown voltage becomes a determinable quantity. If breakdown does occur, damage to the device is not irreversible. The device may be used again.

The principles of this invention can also be applied to a transistor in which the drift region is omitted and to insulated gate bipolar transistors as well as MOSFETs.

DETAILED DESCRIPTION OF THE INVENTION

Figure 3:
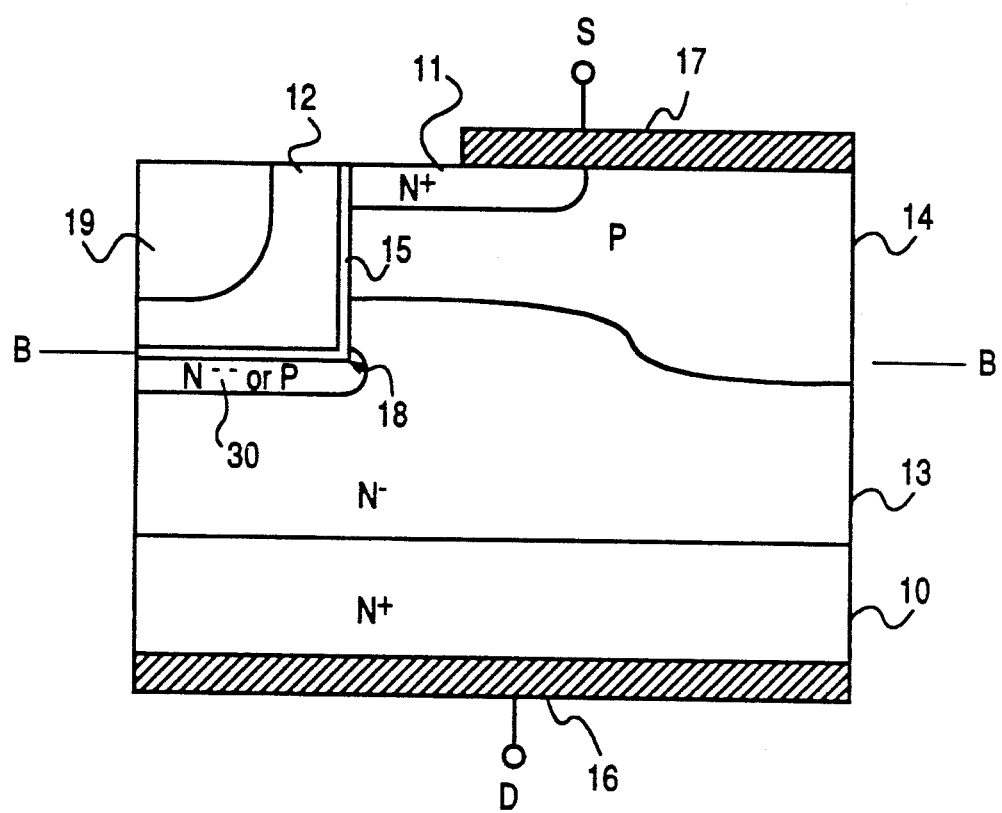
FIG. 3 shows a cross-sectional view of a high-voltage MOSFET constructed in accordance with the invention.

FIG. 3 shows in cross section a power MOSFET constructed in accordance with the invention. The MOSFET of FIG. 3 is generally similar to the MOSFET shown in FIG. 1. In accordance with the invention, however, the intensity of the electric field at point 18 has been found to be reduced substantially by the addition of shield region 30, which is formed by implanting P-type ions (such as boron) in the region adjoining insulating layer 15 directly below gate 12. Various concentrations of P-type ions may be implanted in shield region 30. If relatively low concentrations of these ions are implanted, shield region 30 will remain a very lightly doped N-type material. Alternatively, a higher concentration of the P-type ions may be implanted to convert shield region 30 to a lightly doped P-type material.

The operation of shield region 30 to limit the electric field strength at point 18 can be described as follows. As an increasing voltage is applied at drain terminal 16, the depletion region along the reverse-biased junction between drift region 13 and body region 14 expands a greater distance into drift region 13. At the punch-through voltage, this depletion region makes contact with shield region 30. When this occurs, the voltage in shield region 30 becomes approximately equal to the sum of (a) the voltage in body region 14 and (b) the punch-through voltage, and it does not significantly increase as the voltage at drain terminal 16 is further increased. In this manner, an upper limit is placed on the strength of the electric field at point 18.

Figure 8:
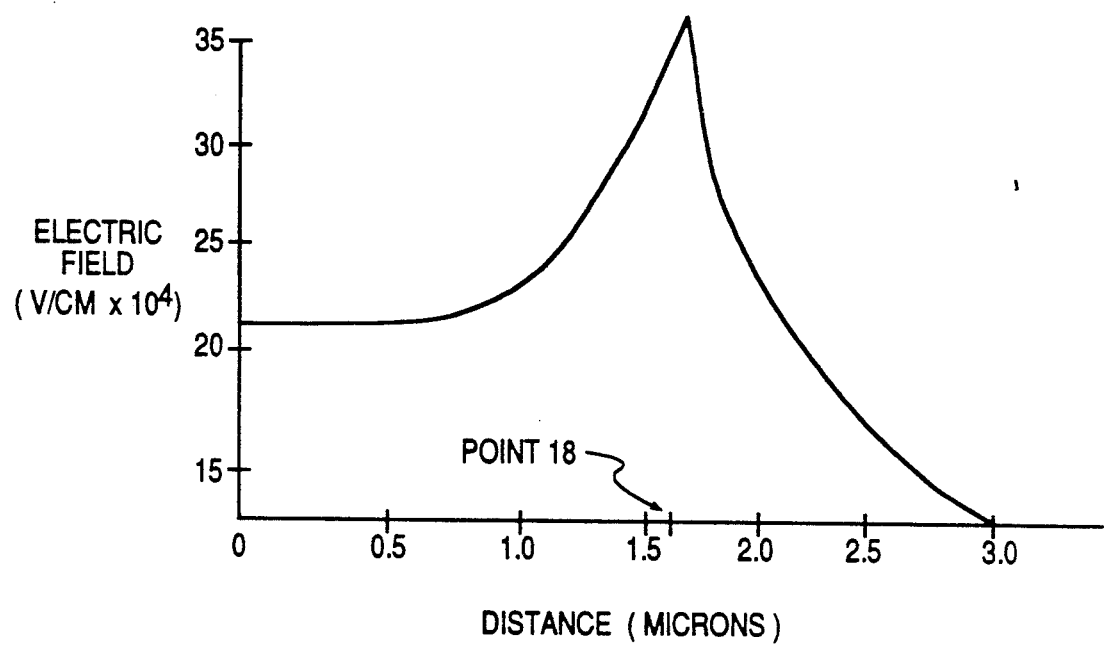
FIG. 8 is a graph illustrating the electric field strength at cross section A—A of the device shown in FIG. 1.
Figure 9:
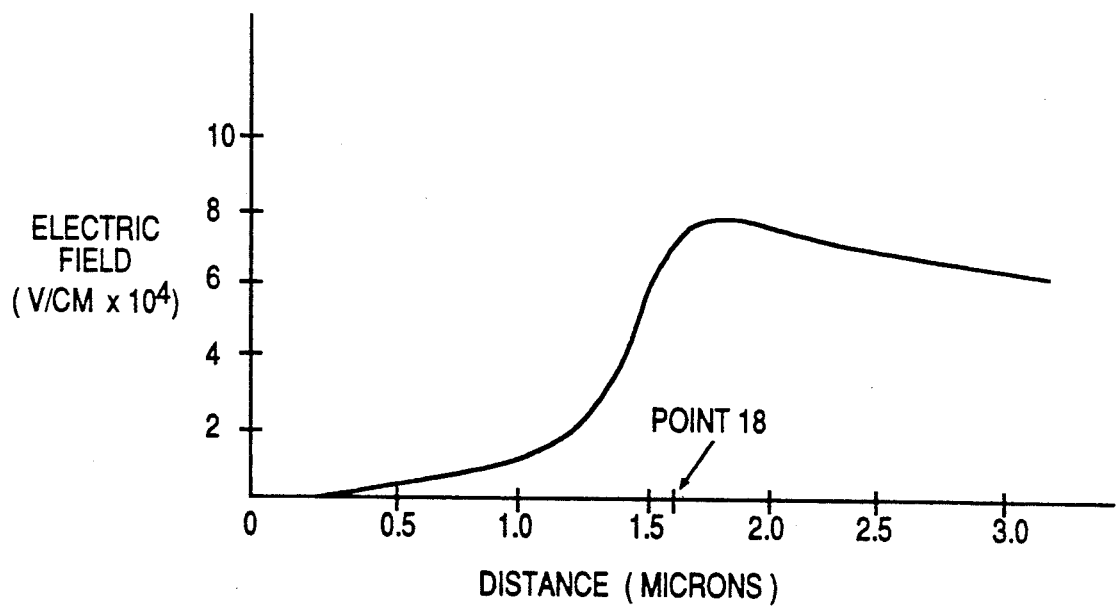
FIG. 9 is a graph illustrating the electric field strength at cross-section B—B of the device shown in FIG. 3.

This effect is illustrated by reference to FIGS. 8 and 9, which were prepared by computer simulation. FIG. 8 shows the strength of the electric field at various points along cross-section A—A in FIG. 1. The horizontal axis begins at the left edge of the device shown in FIG. 1, and the location of point 18 is indicated. It will be noted that the electric field reaches a peak value of approximately $35 \times 10^4$ volts $cm^{-1}$ at point 18. The graph of FIG. 9 shows the strength of the electric fields at points along cross section B—B in FIG. 3. Similarly, zero on the horizontal axis coincides with the left edge of the device, and point 18 is indicated. As shown in FIG. 9, the electric field reaches a peak value of approximately $8 \times 10^4$ volts $cm^{-1}$ at point 18. Accordingly, by using a shield region in accordance with this invention, the strength of the electric field at the critical point 18 has been reduced by a factor of about 4.4.

Figure 1:
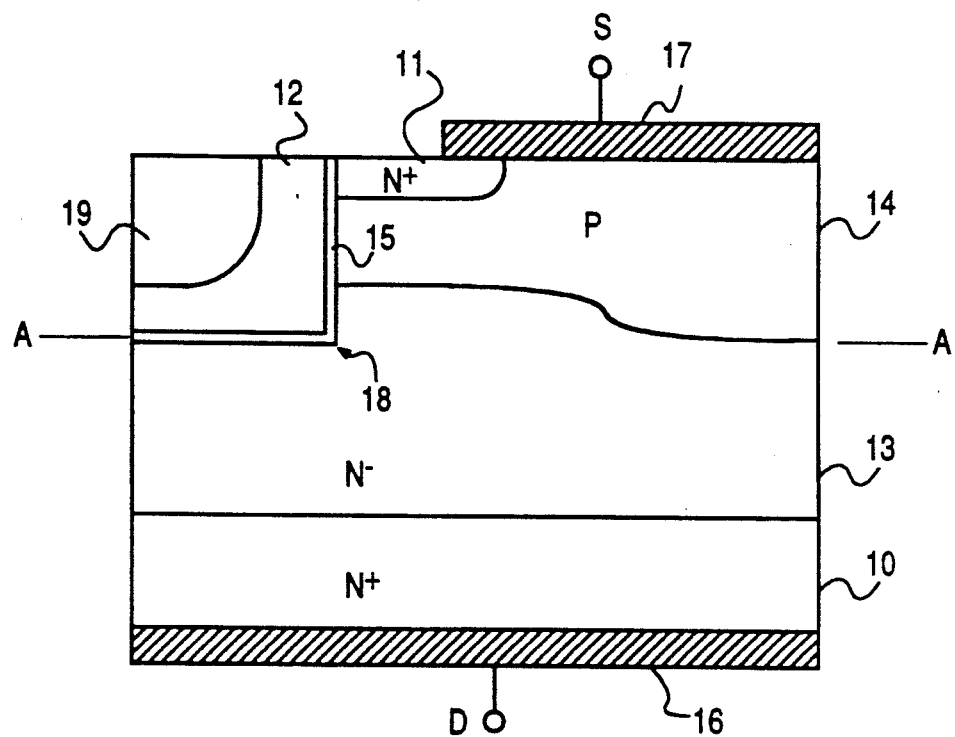
FIG. 1 shows a cross-sectional view of a typical grooved MOSFET in accordance with the prior art.

Moreover, in the embodiment of FIG. 3 voltage breakdown will occur along the junction between drift region 13 and body region 14 instead of at point 18. This means that the voltage at which breakdown will occur can be predicted with considerable precision. In the embodiment of FIG. 1, the level at which breakdown will occur at point 18 is virtually impossible to predict. This feature of the invention will improve the reliability of high-voltage MOSFETs, since a particular breakdown voltage can be specified. Furthermore, since the breakdown occurs at a P-N junction, the device is not irreparably damaged as is normally the case when the breakdown occurs at the boundary between a semiconductor material and the gate insulating layer.

The point on the boundary of the gate insulating layer where the strength of the electric field reaches a maximum need not be a sharp corner. Accordingly, as used herein, the term corner refers to any point on the boundary of the gate insulating layer at which the shape of the boundary causes the strength of the electric field to reach a maximum. Moreover, where the strength of the electric field has more than one local maximum on the boundary of the gate insulating layer, each such maximum will be considered a corner.

Figure 2:
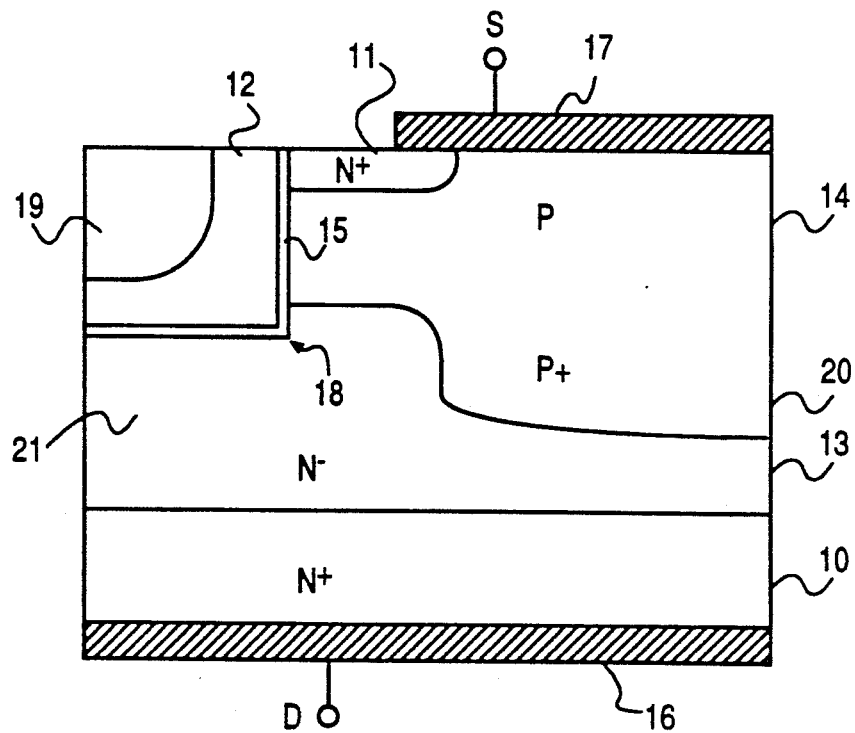
FIG. 2 shows a cross-sectional view of the MOSFET of FIG. 1 which has been modified in accordance with the prior art to alleviate the problem of voltage breakdown.
Figure 4A:
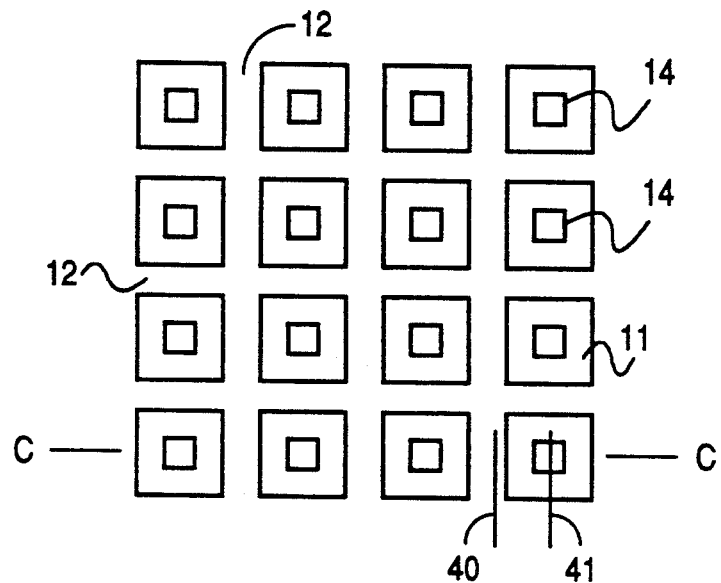
FIGS. 4A, 4B and 4C are illustrative plan views of an array of MOSFETs of the kind shown in FIG. 3 on a semiconductor chip.

It will be understood by those familiar with the art that the structure shown in FIGS. 1-3 is a cross-sectional view of only a portion of a MOSFET, in which the left edge of the drawing coincides with the centerline of gate 12 and the right edge of the drawing coincides with the centerline of body region 14. The MOSFET is normally constructed in the form of an array on a semiconductor chip. FIG. 4A illustrates an example of such an array, with P+ body regions 14 being surrounded by N+ source regions 11 and transected by an orthogonal lattice of trenches comprising a gate 12. The cross sectional views shown in FIGS. 1-3 show, for example, the portion of cross section C—C between axes 40 and 41 in FIG. 4A.

Figure 4B:
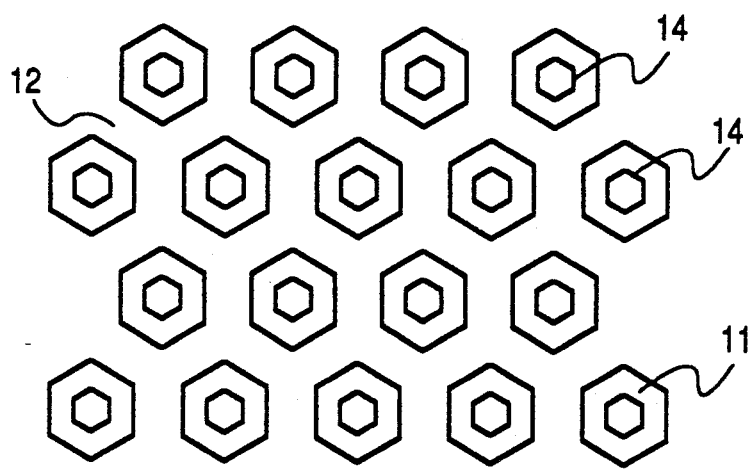
Figure 4C:
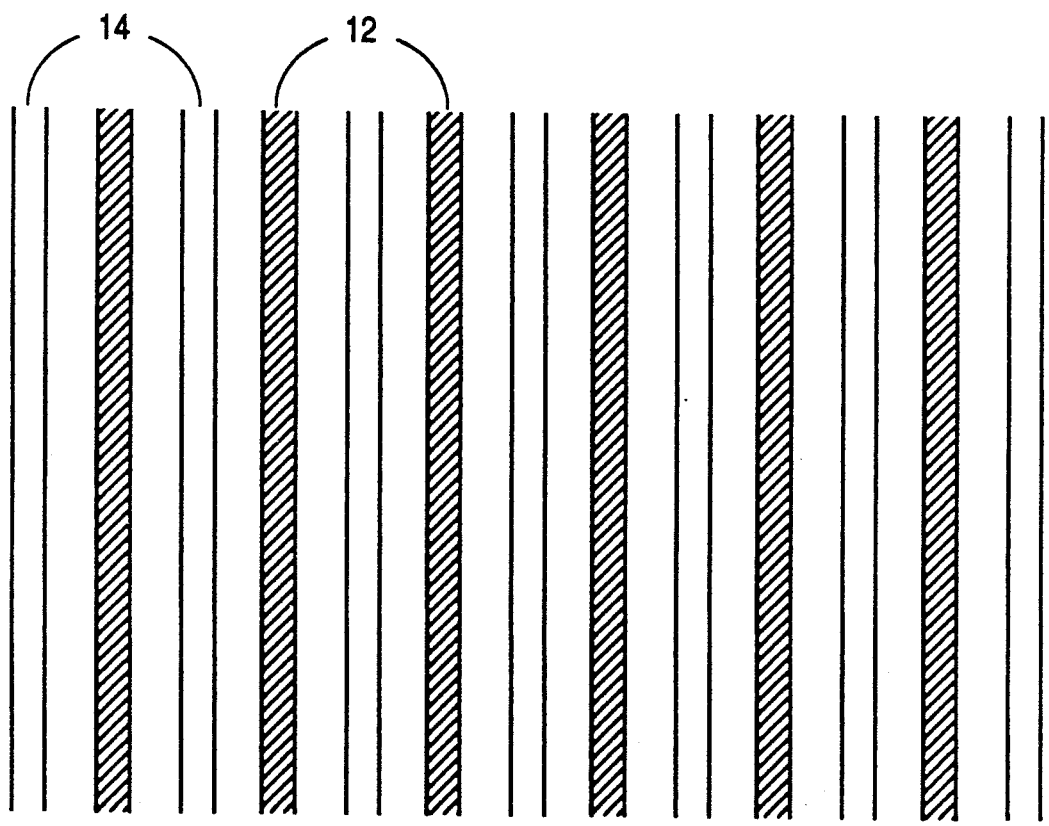

FIGS. 4B and 4C illustrate other types of arrays in which a MOSFET may be constructed, FIG. 4B showing a hexagonal lattice and FIG. 4C showing a linear pattern.

Figure 7A:
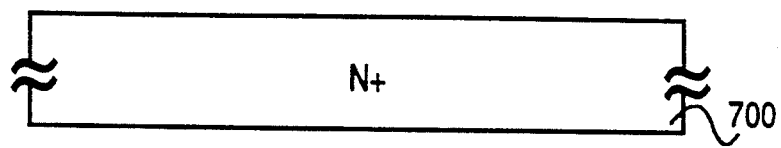
FIGS. 7A through 7Z and 7AA are simplified cross-sectional views of an embodiment of the invention during various stages of fabrication.
Figure 7B:
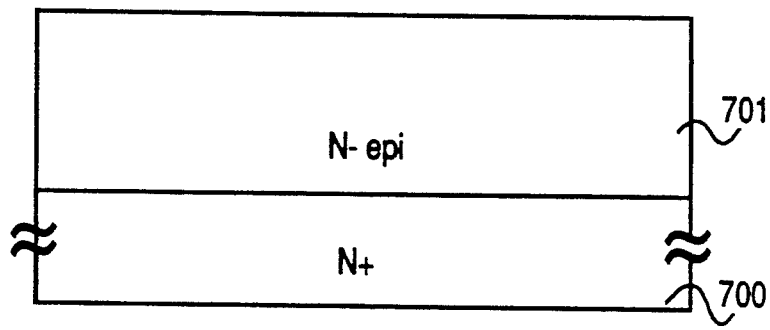
Figure 7C:
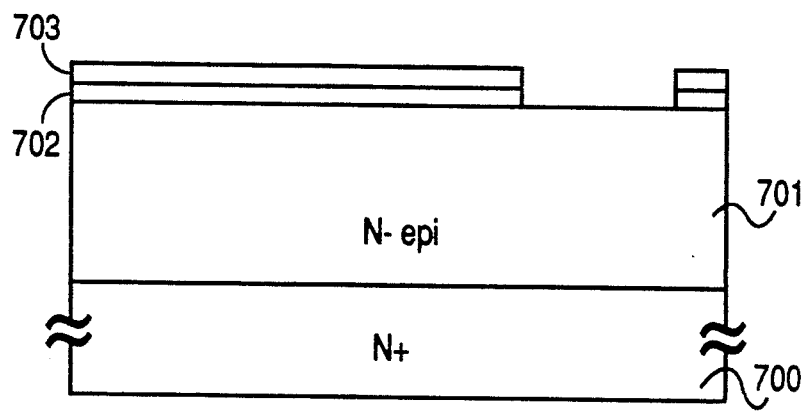
Figure 7D:
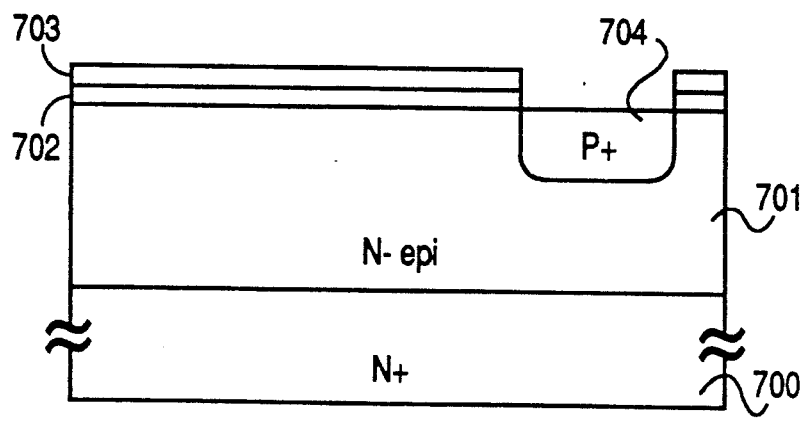
Figure 7E:
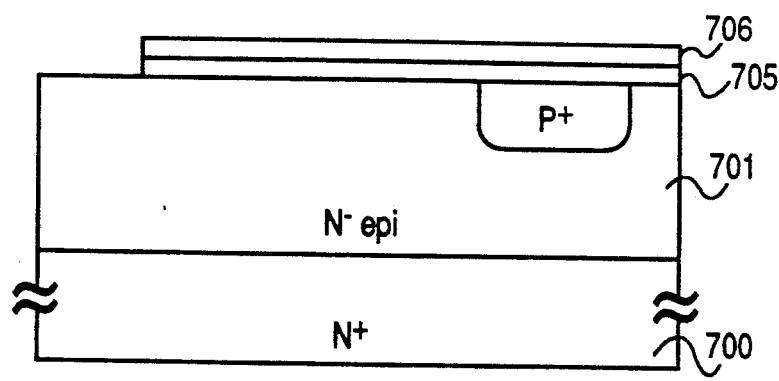
Figure 7F:
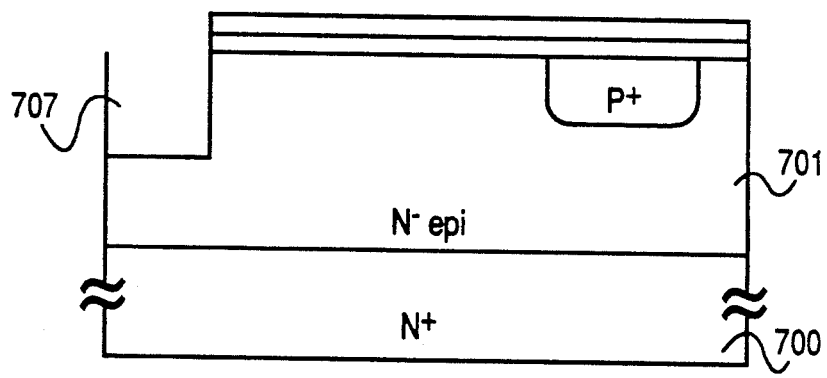
Figure 7G:
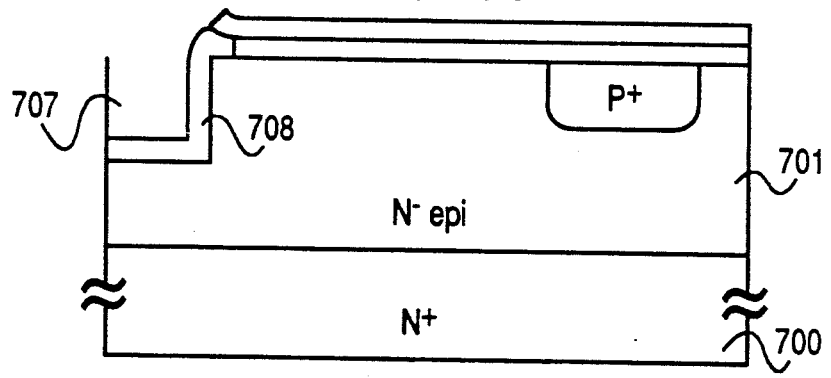
Figure 7H:
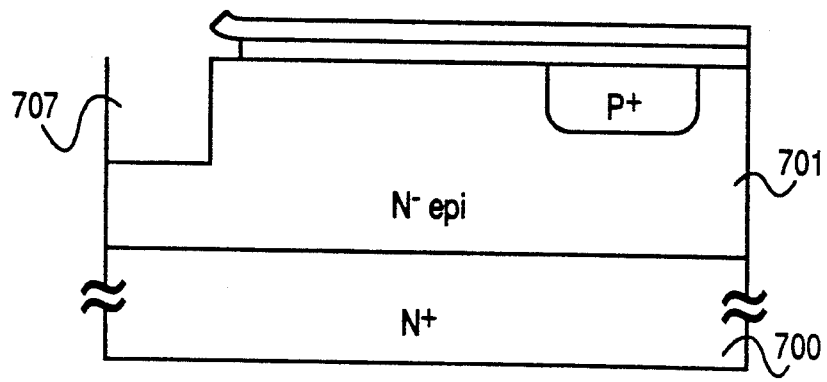
Figure 7I:
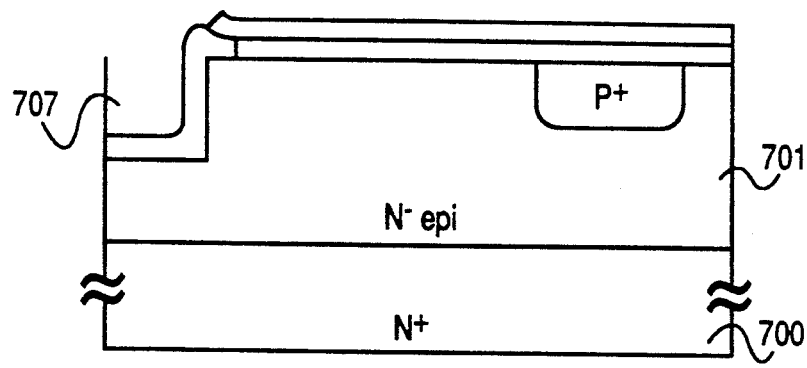
Figure 7J:
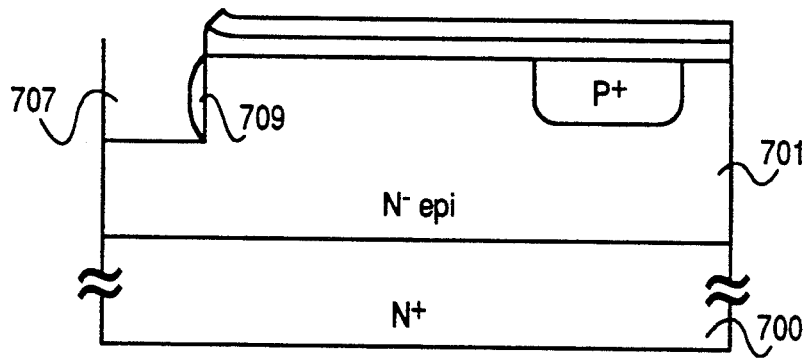

A method of fabricating a preferred embodiment of a MOSFET in accordance with the invention will now be described, with reference to FIGS. 7A through 7Z:

The process begins with a substrate 700 consisting of heavily doped N-type silicon (FIG. 7A). The thickness of substrate 700 is typically in the range of 20-28 mils. An epitaxial layer 701 consisting of lightly doped N-type silicon (thickness 6-20 μm) is then grown on the substrate 700 (FIG. 7B). Layer 701 has an ion concentration in the range of $1 \times 10^{15} - 2 \times 10^{16} cm^{-3}$. A silicon dioxide layer 702 is then deposited on epitaxial layer 701, a photoresist layer 703 is deposited by a masking process on silicon dioxide layer 702, and the exposed portion of silicon dioxide layer 702 is dry etched using the reactive ion etching process (FIG. 7C). A heavily doped P well 704 is then formed by diffusion or ion implantation (FIG. 7D). Silicon dioxide layer 702 and photoresist layer 703 are then removed and are replaced by a silicon dioxide layer 705 and a photoresist layer 706 which is applied by a masking process. Silicon dioxide layer 705 is then dry etched (FIG. 7E). A trench 707 is then formed by reactive ion etching to a depth of approximately 1-4 μm and a width of approximately 1-3 μm. A silicon dioxide layer 708 is thermally grown along the bottom and sides of trench 707 (FIG. 7G), and is then removed in order to clean the bottom and sides of trench 707 (FIG. 7H). Another silicon dioxide layer 709 is thermally grown over the bottom and sides of trench 707 (FIG. 7I), and is then dry etched using the reactive ion etching process so that the portion of silicon dioxide layer 709 covering the bottom of trench 707 is removed. (FIG. 7J).

Figure 7K:
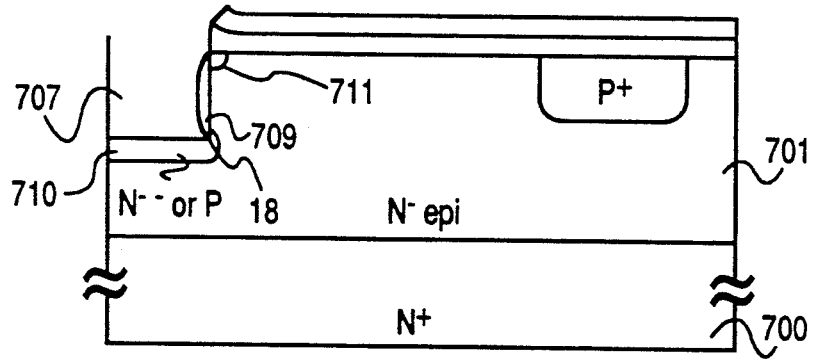

Boron ions are then implanted into the bottom of trench 707 at a concentration of $1 \times 10^{12} - 1 \times 10^{14}$ $cm^{-2}$ to form shield region 710, a region of P-type conductivity, at the bottom of trench 707 (FIG. 7K). Preferably, the doping concentration is in the range of $1 \times 10^{12} - 1 \times 10^{13}$ ions $cm^{-2}$. As a result, region 710 has a P-ion concentration in the range of $1 \times 10^{16} - 1 \times 10^{20}$ $cm^{-3}$. As described above, shield region 710 provides the buffering function which reduces the strength of the field at point 18, a corner on the surface of trench 707. As shown in FIG. 7K, shield region 710 overlaps point 18, and a small region 711 of lightly doped P-type conductivity may be formed parasitically at the lip of trench 707. Alternatively, shield region 710 could be formed as a region of very lightly doped N-type conductivity by implanting the boron ions at a concentration of $1 \times 10^{11} - 1 \times 10^{12} cm^{-2}$, yielding a shield region 710 with an N-ion concentration in the range of $5 \times 10^{13} - 5 \times 10^{15} cm^{-3}$. If this is done, the strength of the electric field at point 18 will be reduced as a result of reduced N type doping in the vicinity of point 18. While boron ions are preferred for doping shield region 710, ions of other Group IIIa elements such as indium, gallium or aluminum may also be used.

Figure 7L:
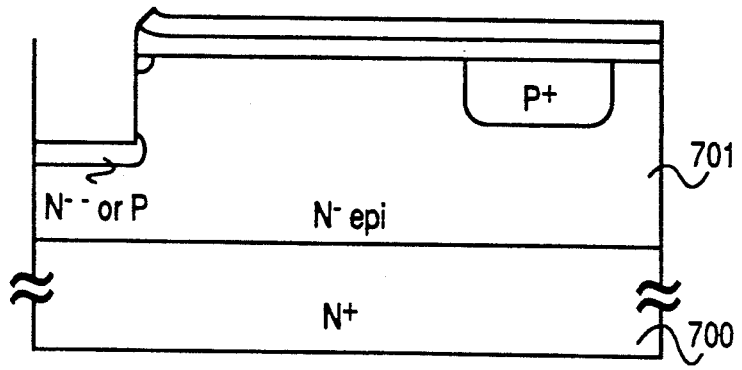
Figure 7M:
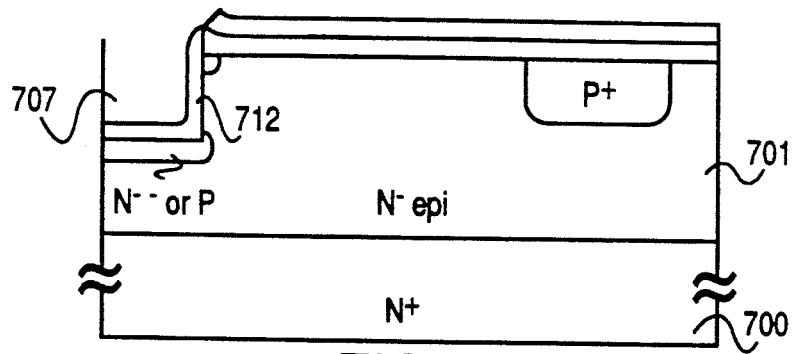
Figure 7N:
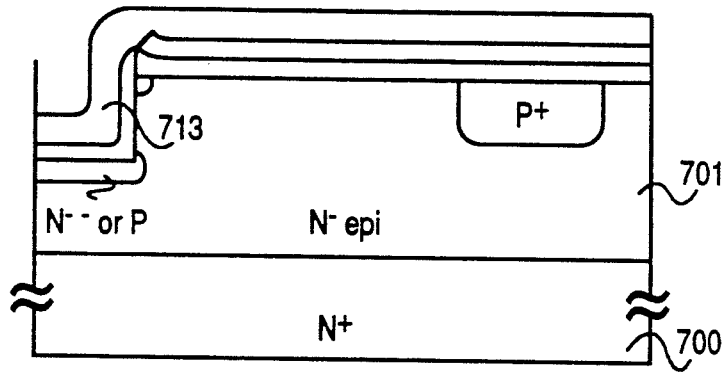
Figure 7O:
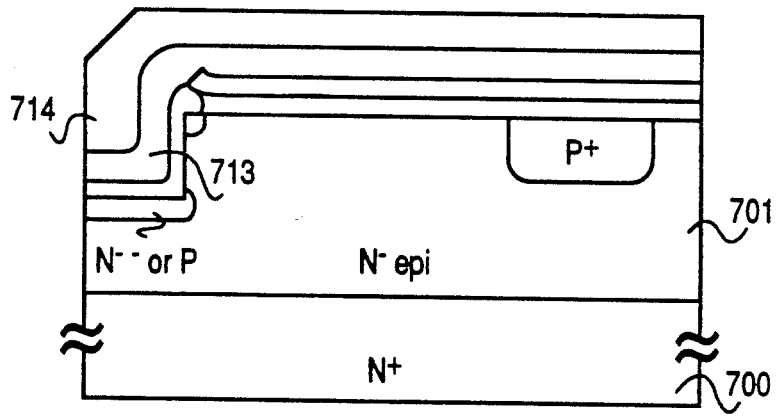

After shield region 710 has been formed, the remainder of silicon dioxide layer 709 is removed from the side of trench 707 (FIG. 7L), and a gate insulation layer 712 is thermally grown along the sides and bottom of trench 707 (FIG. 7M). A polysilicon gate layer 713 is then deposited (FIG. 7N), followed by a low temperature oxide layer 714 (FIG. 7O). Low temperature oxide layer 714 may also be a layer of borophosphosilicate glass (BPSG) or phosphosilicate glass (PSG).

Figure 7P:
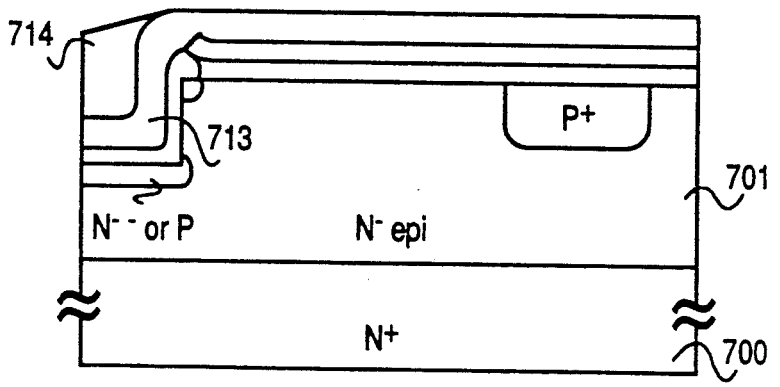
Figure 7Q:
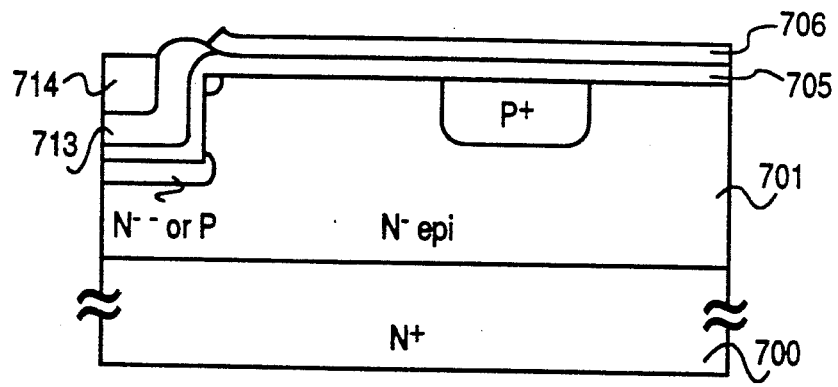
Figure 7R:
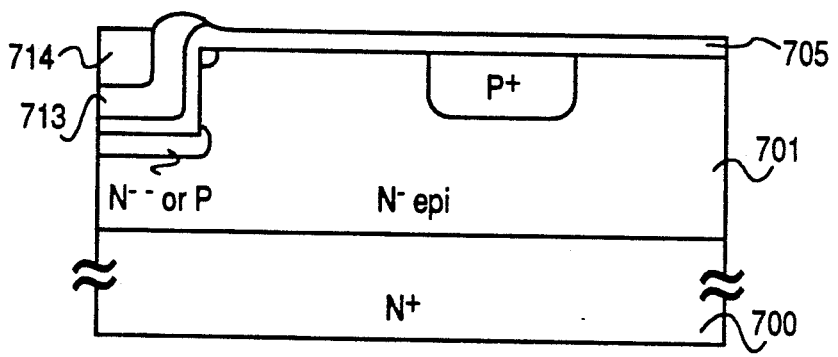

To planarize the trench, low temperature oxide layer 714 is first etched (FIG. 7P), and then, using a polysilicon mask, polysilicon layer 713 is etched back to the level of photoresist layer 706 (FIG. 7Q). Photoresist layer 706 is then removed and polysilicon layer 713 is selectively dry etched to further planarize the trench (FIG. 7R).

Figure 7S:
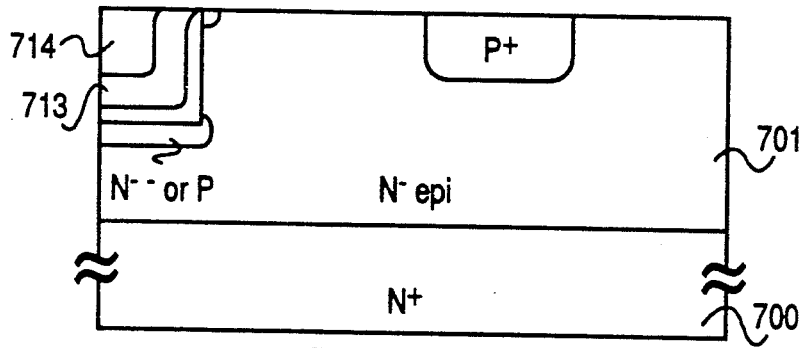
Figure 7T:
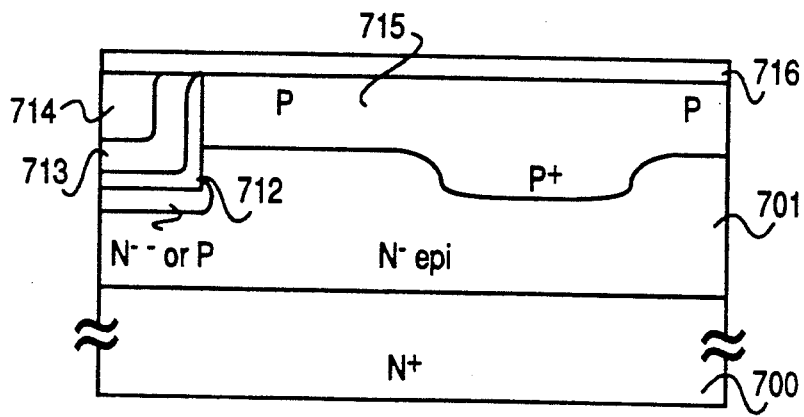
Figure 7U:
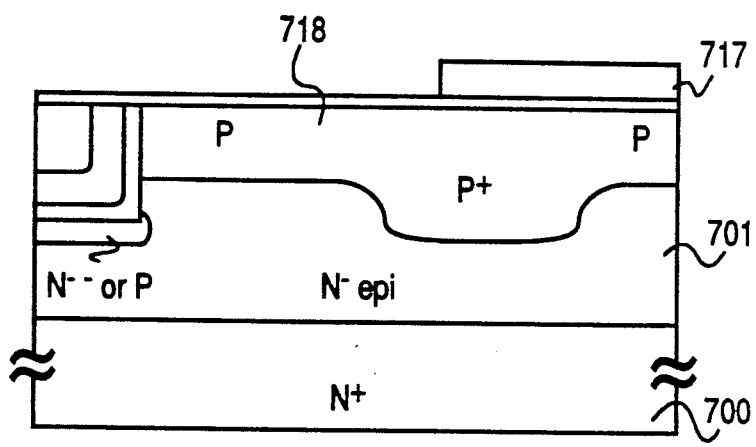
Figure 7V:
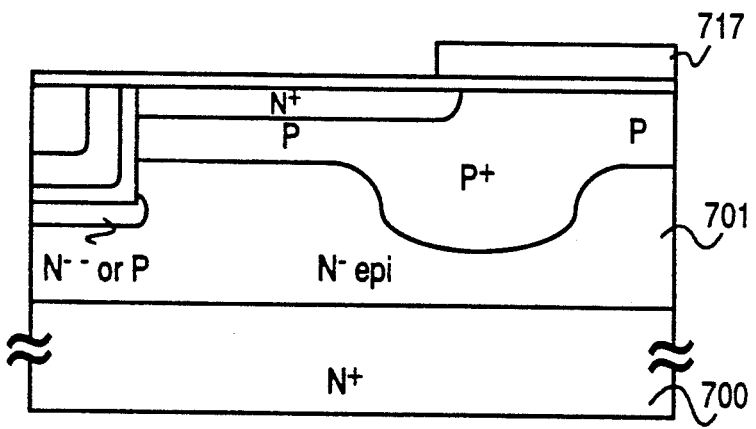
Figure 7W:
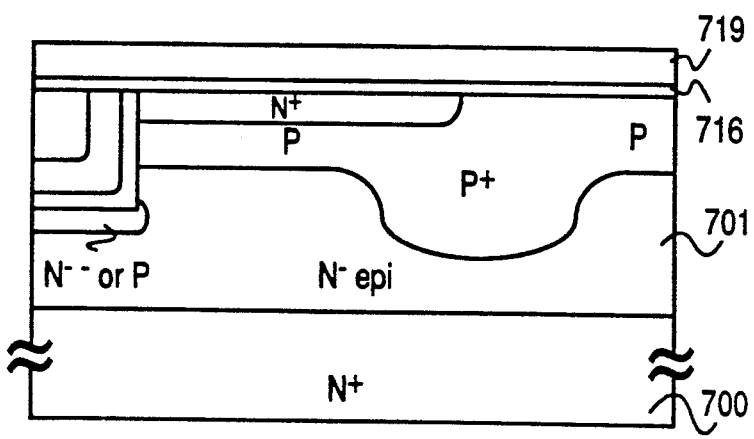

Silicon dioxide layer 705 is then removed by selective etching (FIG. 7S). Boron ions are implanted at a concentration of $5 \times 10^{13} - 2 \times 10^{14}$ cm$^{-2}$ at the top surface of epitaxial layer 701, and are driven in, to form a P-type body region 715 (FIG. 7T). This implantation process does not adversely affect gate insulation layer 712, polysilicon layer 713 or low temperature oxide layer 714. As a result of the implantation process, a screen silicon dioxide layer 716 is formed. Photoresist layer 717 is then formed by a masking process (FIG. 7U), and arsenic or phosphorous ions are implanted at a concentration of $3 \times 10^{15} - 8 \times 10^{15}$ cm$^{-2}$ to form source region 718 (FIG. 7V). Photoresist layer 717 is then removed and interlayer dielectric 719 is deposited or thermally grown on screen silicon dioxide layer 716 (FIG. 7W).

Figure 7X:
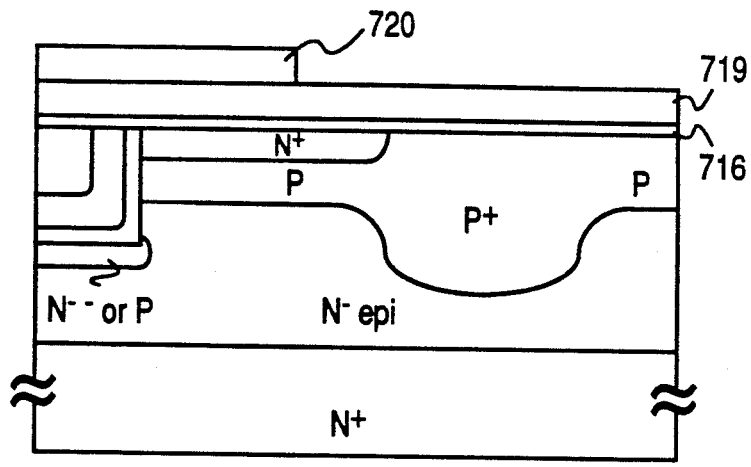
Figure 7Y:
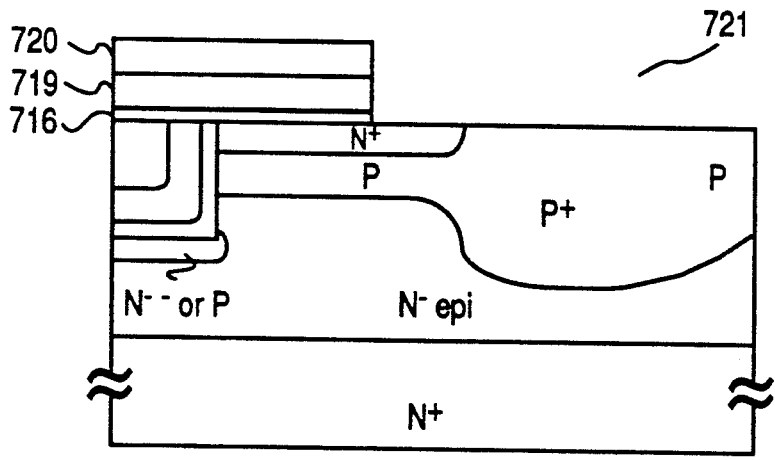

A photoresist layer 720 is formed on interlayer dielectric 719 (FIG. 7X), and interlayer dielectric 719 and screen silicon dioxide layer 716 are etched to form source contact window 721 (FIG. 7Y). Photoresist layer 720 is removed. A metal source contact layer 722 (typically 3 μm thick) and a passivation layer 723 (typically Si$_2$N$_4$ or SiO$_2$ about 1 μm thick) are deposited. The bottom surface of the wafer is cleaned and a drain contact layer 724, consisting of an alloyable metal, is deposited (FIG. 7Z).

Alternatively, instead of depositing low temperature oxide (or BPSG or PSG) layer 714, a thicker polysilicon gate layer 713 can be deposited prior to planarization (FIGS. 7O-7P). This alternative process is particularly suitable for embodiments having narrow gate trenches. Immediately following the deposition of the thick polysilicon gate layer 713 the device would appear as shown in FIG. 7AA. Gate layer 713 is then etched back to the level of photoresist layer 706, and the process described in conjunction with FIGS. 7R-7Z is carried out.

The depth of P body well 704 (FIG. 7D) can be varied so as to achieve desired voltage breakdown characteristics. For low voltage devices, the diffusion or ion implantation process may be carried out to yield a bottom of well 704 which is at a level either above the bottom of trench 707 or less than about 0.5 μm below the bottom of trench 707. For high voltage devices, the diffusion or implantation process is carried out so that the bottom of well 704 is at a level more than 0.5 μm below the bottom of trench 707.

Figure 6A:
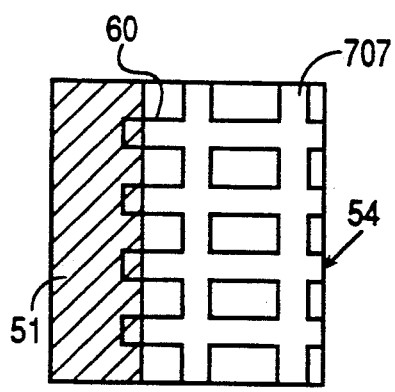
FIGS. 6A, 6B and 6C show details of the connections with the gate pad and certain other elements of FIG. 5.
Figure 5:
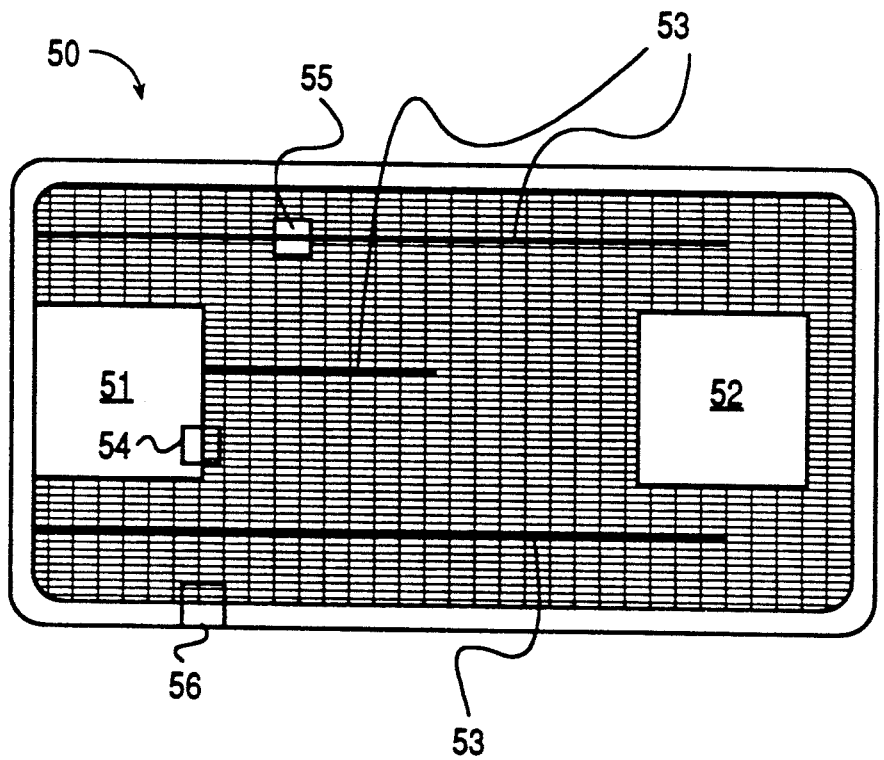
FIG. 5 is a top view of a semiconductor chip showing an array of MOSFETs and respective gate and source connection pads.

FIG. 5 shows a top view of a chip 50 which contains a gate contact pad 51, a source contact pad 52 and conductive gate runners 53. To form gate pad 51, photoresist layer 706 (FIG. 7E) is formed so as to cover an area slightly smaller than the area of chip 50 to be occupied by gate pad 51. In the area overlain by photoresist layer 706, trenches 707 are not formed by the reactive ion etching process described in conjunction with FIG. 7F, and instead trenches 707 end in "fingers" 60 as shown in FIG. 6A, which is a detailed view of area 54 in FIG. 5.

Figure 6B:
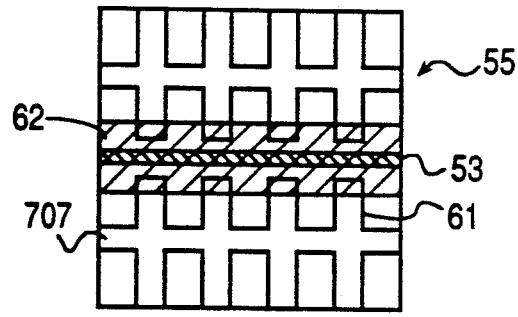
Figure 6C:
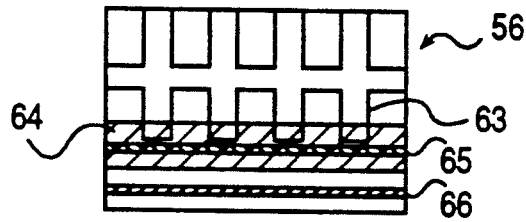

Trenches 707 also end in fingers 61 along gate runners 53. This is shown in FIG. 6B, which is a detailed view of area 55 in FIG. 5. A polysilicon layer 62 overlaps and electrically contacts the top surface of fingers 61. Similarly, a polysilicon layer 64 overlaps trench fingers 63 around the perimeter of chip 50, as shown in the detailed view of FIG. 6C (area 56). A metal contact layer is then deposited on the polysilicon layer in the area of gate pad 51 and on polysilicon layers 62 and 64, resulting in the formation of gate runners 53 and 65, respectively (FIG. 6B and 6C). Metal gate runners 53 and 65 and the metal layer on gate pad 51 are all in electrical contact with one another. The function of gate runners 53 and 65 is to minimize the delay in the transmission of a signal from gate pad 51 to gate trenches 707 over the entire surface of chip 51.

Source pad 52 is formed by allowing the top surface of metal source contact layer 722 (FIG. 7Z) to remain exposed in the rectangular area shown in FIG. 5. As shown in FIG. 7Z, source contact layer 722 is insulated from gate layer 713 by silicon dioxide layer 716 and interlayer dielectric 79.

The perimeter of chip 50 contains structures that are known in the art and are consistent with the character and function of the chip. For example, a P region 66 as shown in FIG. 6C may be used as a shield for chip 50. If chip 50 is to be a high voltage device, additional shield regions may be formed around its perimeter.

Figure 7Z:
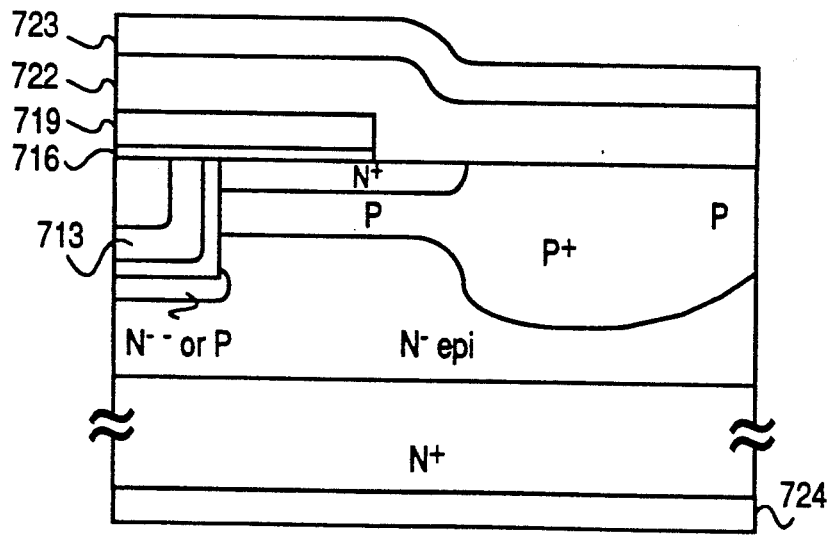
Figure 7A:
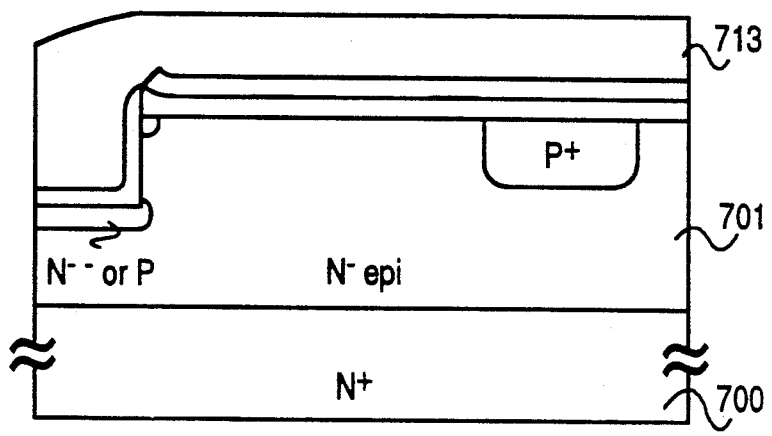

Finally, appropriate connection terminals are attached to gate pad 51, source pad 52 and drain contact layer 724 (FIG. 7Z).

Figure 10:
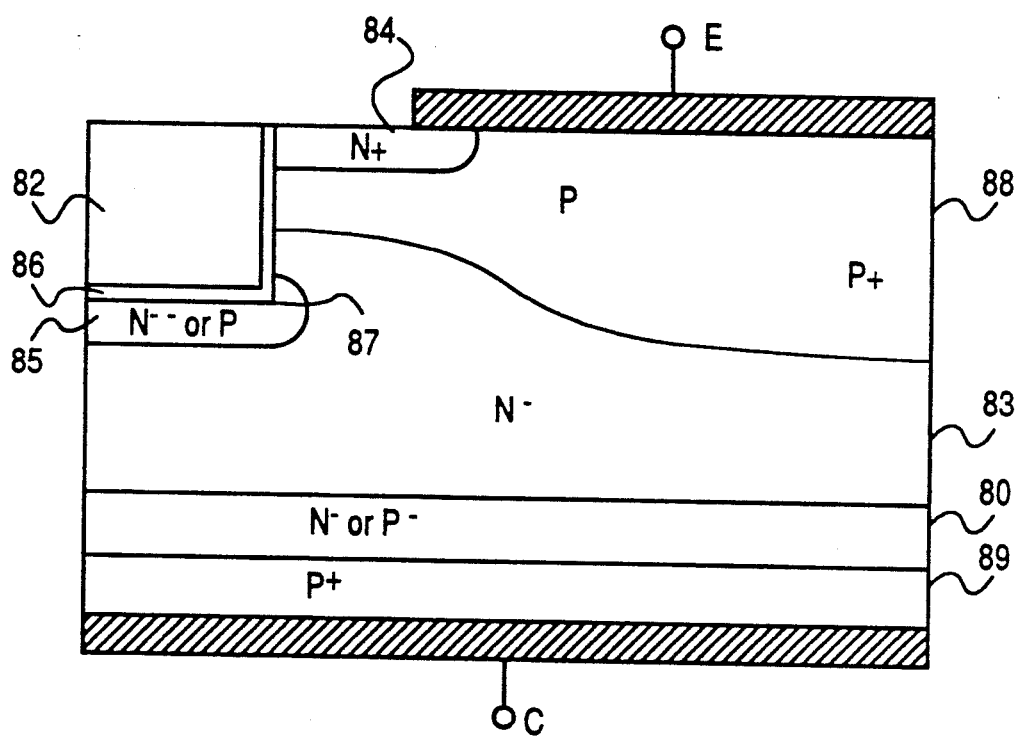
FIG. 10 shows a cross-sectional view of an insulated gate bipolar transistor (IGBT) constructed in accordance with the invention.

An insulated gate bipolar transistor (IGBT) can also be constructed using the principles of this invention, as shown in FIG. 10. The embodiment of FIG. 10 can be viewed as a PNP bipolar junction transistor (BJT) with a emitter 89 and an collector/body region 88 separated by lightly doped N or P drain region 80 and a lightly doped N base/drift region 83. This BJT is driven by an NPN MOSFET of the kind described above having a gate 82, a source region 84, a collector/body region 88, a base/drift region 83 and a drain region 80. A shield region 85 is located under gate 82 adjacent to insulating layer 86.

In operation, emitter 89 is connected to a positive voltage and base/drift region 83 is connected to ground or to a negative voltage, so as to forward bias the PN junction between emitter 89 and drain region 80. Base/drift region 83 is grounded by applying a positive voltage to gate 82, thereby creating an inversion channel between source region 84 and base/drift region 83 and turning the MOSFET "on". The inversion channel is in collector/body region 88 adjacent to insulating layer 86, and it essentially ties base/drift region 83 to ground. As a result, electrons flow from source region 84 and combine with holes flowing from emitter 89. Some of the holes injected by emitter 89 reach collector/body region 88 and form the collector current of the device. As compared with the MOSFET of FIG. 3, the IGBT of FIG. 10 has a lower voltage drop and is therefore useful at somewhat higher voltages (greater than about 200 V), although its somewhat slower speed limits its usefulness to frequencies less than about 50 Khz. Further details and an equivalent circuit for the IGBT are given in an article entitled "Insulated Gate Transistor Physics: Modeling and Optimization of the On-State Characteristics", by H. Yilmaz et al., IEEE Transactions on Electron Devices, Vol. ED-32, No. 12, December 1985 which article is incorporated herein in its entirety.

During the operation of the IGBT, and in the absence of shield region 85, the electric field in base/drift region 83 would reach a maximum at point 87 along the junction with insulating layer 86. In the manner described above, shield region 85 limits the voltage at point 87 to a value which is approximately equal to the sum of the voltage in collector/body region 88 and the punch-through voltage. The device will break down along the junction between base/drift region 83 and collector/body region 88 rather than at point 87.

The fabrication of an IGBT is very similar to the process described above for a MOSFET, the sole difference being in the initial steps. Referring to FIG. 10, an epitaxial layer 80 of lightly doped N or P material is grown on a heavily doped P substrate 89. The remaining steps are exactly as described above and as illustrated in FIGS. 7B–7Z, beginning with the growing of lightly doped N epitaxial layer 701 shown in FIG. 7B, which is equivalent to base/drift region 83 in FIG. 11.

While the invention has been shown and described with reference to preferred embodiments thereof, it will be understood by those skilled in the art that the foregoing and other changes in form and detail may be made therein without departing from the scope and spirit of the invention. For example, while the embodiment of FIG. 3 includes a U-shaped groove, the invention is equally applicable to transistors in which the cross-sectional shape of the groove or trench is a "V" or other configuration. Moreover, it will be understood that the conductivities of the semiconductor materials may be opposite to those described, and that the drift region can be omitted entirely and the shield region can be formed in the drain region. If the conductivities of the semiconductor materials are reversed, the doping of shield region 710 (FIG. 7K) would be accomplished by implanting phosphorus, arsenic or antimony ions into an epitaxial layer of lightly doped P-type silicon. The ion concentration levels for the ion implantation process and the resulting shield region would the same as disclosed above and would produce a shield region consisting of N-type material or very lightly doped P-type material.

I claim:

1. A metal-oxide-semiconductor field effect transistor in a grooved or trench configuration and comprising the following regions in succession:
   a source region of a first conductivity type;
   a body region of a second conductivity type; and
   a drain region of said first conductivity type; and additionally comprising
   a gate formed in a trench or groove, said trench or groove extending through said body region into said drain region, said gate bordered by an insulating layer, said insulating layer having a boundary, and said boundary including a corner; and
   a shield region bounded by said drain region and said insulating layer and adjacent to said corner, said shield region being of said first conductivity type and being doped to a lesser degree than said drain region, said shield region operating to inhibit voltage breakdown at or near said corner.

2. The metal-oxide-semiconductor field effect transistor of claim 1 in which said shield region has an ion concentration in the range of about $5 \times 10^{13}$ to about $5 \times 10^{15}$ cm$^{-3}$.

3. A metal-oxide-semiconductor field effect transistor in a grooved or trench configuration and comprising the following regions in succession:
   a source region of a first conductivity type;
   a body region of a second conductivity type; and
   a drain region of said first conductivity type; and additionally comprising
   a gate formed in a trench or groove, said trench or groove extending through said body region into said drain region, said gate bordered by an insulating layer, said insulating layer having a boundary, and said boundary including a corner; and
   a shield region bounded by said drain region and said insulating layer and adjacent to said corner, said shield region being of said second conductivity type, said shield region operating to inhibit voltage breakdown at or near said corner.

4. The metal-oxide-semiconductor field effect transistor of claim 3 in which said shield region has an ion concentration in the range of about $1 \times 10^{16}$ to about $1 \times 10^{20}$ cm$^{-3}$.

5. The metal-oxide-semiconductor field effect transistor of claim 2 or 4 wherein said body region includes a well of relatively heavily doped material.

6. The metal-oxide-semiconductor field effect transistor of claim 5 wherein the bottom of said well is located at a level 0.5 $\mu$m or more below the bottom of said trench.

7. The metal-oxide-semiconductor field effect transistor of claim 5 wherein the bottom of said well is located at a level higher than 0.5 $\mu$m below the bottom of said trench.

8. The metal-oxide-semiconductor field effect transistor of claim 2 or 4 wherein said gate partially surrounds a dielectric region.

9. The metal-oxide-semiconductor field effect transistor of claim 8 wherein said dielectric region is selected from the group consisting of borophosphosilicate glass, phosphosilicate glass or a low temperature oxide.

10. A semiconductor chip including a plurality of the transistors claimed in claims 2 or 4 wherein said trenches form a lattice configuration.

11. The semiconductor chip of claim 10 wherein said trenches form an orthogonal lattice.

12. The semiconductor chip of claim 10 wherein said trenches form a hexagonal lattice.

13. A semiconductor chip including a plurality of the transistors claimed in claims 2 or 4 wherein said trenches form a series of substantially parallel lines.

14. A metal-oxide-semiconductor field effect transistor in a grooved or trench configuration and comprising the following regions in succession:
   a source region of a first conductivity type;
   a body region of a second conductivity type;
   a drift region of said first conductivity type; and
   a drain region of said first conductivity type; and additionally comprising
   a gate formed in a trench or groove, said trench or groove extending through said body region into said drift region, said gate bordered by an insulating layer, said insulating layer having a boundary, and said boundary including a corner; and a shield region bounded by said drift region and said insulating layer and adjacent to said corner, said shield region being of said first conductivity type and being doped to a lesser degree than said drift region, said shield region operating to inhibit voltage breakdown at or near said corner.

15. A metal-oxide-semiconductor field effect transistor of claim 14 in which said shield region has an ion concentration in the range of about $5 \times 10^{13}$ to about $5 \times 10^{15}$ cm$^{-3}$.

16. A metal-oxide-semiconductor field effect transistor in a grooved or trench configuration and comprising the following regions in succession:
a source region of a first conductivity type;
a body region of a second conductivity type;
a drift region of said first conductivity type; and
a drain region of said first conductivity type; and additionally comprising
a gate formed in a trench or groove, said trench or groove extending through said body region into said drift region, said gate bordered by an insulating layer, said insulating layer having a boundary, and said boundary including a corner; and
a shield region bounded by said drift region and said insulating layer and adjacent to said corner, said shield region being of said second conductivity type, said shield region operating to inhibit voltage breakdown at or near said corner.

17. The metal-oxide-semiconductor field effect transistor of claim 16 in which said shield region has an ion concentration in the range of about $1 \times 10^{16}$ to about $1 \times 10^{20}$ cm$^{-3}$.

18. The metal-oxide-semiconductor field effect transistor of claims 15 or 17 wherein said body region includes a well of relatively heavily doped material.

19. The metal-oxide-semiconductor field effect transistor of claim 18 wherein the bottom of said well is located at a level 0.5 μm or more below the bottom of said trench.

20. The metal-oxide-semiconductor field effect transistor of claim 18 wherein the bottom of said sell is located at a level higher than 0.5 μm below the bottom of said trench.

21. The metal-oxide-semiconductor field effect transistor of claims 15 or 17 wherein said gate partially surrounds a dielectric region.

22. The metal-oxide-semiconductor field effect transistor of claim 21 wherein said dielectric region is selected from the group consisting of borophosilicate glass, phosphosilicate glass or a low temperature oxide.

23. A semiconductor chip including a plurality of the transistors claimed in claims 15 or 17 wherein said trenches form a lattice configuration.

24. The semiconductor chip of claim 23 wherein said trenches form an orthogonal lattice.

25. The semiconductor chip of claim 23 wherein said trenches form a hexagonal lattice.

26. A semiconductor chip including a plurality of the transistors claimed in claims 15 or 17 wherein said trenches form a series of substantially parallel lines.

27. An insulated gate bipolar transistor in a grooved or trench configuration and comprising the following regions in succession:
a source region of a first conductivity type;
a collector/body region of a second conductivity type;
a base/drift region of said first conductivity type;
a drain region; and
an emitter of said second conductivity type; and additionally comprising
a gate formed in a trench or groove, said trench or groove extending through said collector/body region into said base/drift region, said gate bordered by an insulating layer, said insulating layer having a boundary, and said boundary including a corner; and
a shield region bounded by said base/drift region and said insulating layer and adjacent to said corner, said shield region being of said first conductivity type and being doped to a lesser degree than said base/drift region, said shield region operating to inhibit voltage breakdown at or near said corner.

28. The insulating gate bipolar transistor of claim 27 in which said shield region has an ion concentration in the range of about $5 \times 10^{-}$ to about $5 \times 10^{15}$ cm$^{-3}$.

29. An insulated gate bipolar transistor in a grooved or trench configuration and comprising the following regions in succession:
a source region of a first conductivity type;
a collector/body region of a second conductivity type;
a base/drift region of said first conductivity type;
a drain region; and
an emitter of said second conductivity type; and additionally comprising
a gate formed in a trench or groove, said trench or groove extending through said collector/body region into said base/drift region, said gate bordered by an insulating layer, said insulating layer having a boundary, and said boundary including a corner; and
a shield region bounded by said base/drift region and said insulating layer and adjacent to said corner, said shield region being of said second conductivity type, said shield region operating to inhibit voltage breakdown at or near said corner.

30. The insulated gate bipolar transistor of claim 29 in which said shield region has an ion concentration in the range of about $1 \times 10^{16}$ to about $1 \times 10^{20}$ cm$^{-3}$.

31. The insulated gate bipolar transistor of claims 28 or 30 wherein said collector/body region includes a well of relatively heavily doped material.

32. The insulated gate bipolar transistor of claim 31 wherein the bottom of said well is located at a level 0.5 μm or more below the bottom of said trench.

33. The insulated gate bipolar transistor of claim 31 wherein the bottom of said well is located at a level higher than 0.5 μm below the bottom of said trench.

34. The insulated gate bipolar transistor of claims 28 or 30 wherein said gate partially surrounds a dielectric region.

35. The insulated gate bipolar transistor of claim 34 wherein said dielectric region is selected from the group consisting of borophosphosilicate glass, phosphosilicate glass or a low temperature oxide.

36. A semiconductor chip including a plurality of the transistors claimed in claims 28 or 30 wherein said trenches form a lattice configuration.

37. The semiconductor chip of claim 36 wherein said trenches form an orthogonal lattice.

38. The semiconductor chip of claim 36 wherein said trenches form a hexagonal lattice.

39. A semiconductor chip including a plurality of the transistors claimed in claims 28 or 30 wherein said trenches form a series of substantially parallel lines.

* * * * *

UNITED STATES PATENT AND TRADEMARK OFFICE
CERTIFICATE OF CORRECTION

PATENT NO.    : 5,168,331
DATED         : December 1, 1992
INVENTOR(S)   : Hamza Yilmaz It is certified that error appears in the above-identified patent and that said Letters Patent is hereby corrected as shown below:

At column 9, line 41 in Claim 20, delete "sell" and insert --well--;

At column 10, line 17 in Claim 28, delete "10-" and insert --$10^{13}$--

Signed and Sealed this

Nineteenth Day of July, 1994

Attest:

BRUCE LEHMAN

Attesting Officer      Commissioner of Patents and Trademarks